United States Patent Office 3,350,202

Patented Oct. 31, 1967

3,350,202

METHOD OF XEROGRAPHICALLY PHOTO-SENSITIZING PLANOGRAPHIC PRINTING PLATES

Julius L. Silver, Somerset, Franklin Township, N.J., assignor to Union Carbide Corporation, a corporation of New York No Drawing. Filed Oct. 27, 1964, Ser. No. 406,925
20 Claims. (Cl. 96—1.4)

The present invention relates to a method of xerographically photosensitizing a photosensitizable planographic printing plate.

More particularly the present invention relates to a method of "image photosensitizing" a photosensitizable planographic printing plate base.

By the term "image photosensitization" is meant that the printing plate surface is photosensitized only in image areas. Non-image areas remain non-photosensitive or proportionately so in tone areas. Thus the plate so sensitized is capable of producing prints after exposure to light.

Photosensitizable planographic printing plates generally consists of a photosensitive coating on an aluminum or other water-wettable substrate. A transparent negative is placed over the plate and the plate is then exposed to a light source through the negative.

Xerographic copying is well known in the art. It generally comprises projecting an image of the object to be copied onto an electrostatically charged plate or drum coated with a material which loses electrostatic charge on exposure to light. This charge loss is local and is proportional to the amount of light striking the charged surface. The drum is then dusted with a finely divided pigmented polymeric material which adheres to the drum or plate in an amount proportional to the charge on the drum. The pigmented polymeric dust is then transferred to a suitable substrate such as paper and is heated to melt the polymer dust causing it to adhere to the substrate.

The utilization of this method to prepare printing plates has heretofore involved the same procedure except that the substrate utilized generally exhibited a high degree of hydrophillicity and the polymeric fusible material generally exhibited a high degree of hydrophobicity. While these plates will print they tend to be limited to short printing periods because the fused plastic image tends to wear. Additionally this type of printing plate generally does not reproduce photographic copy well but rather is limited to line copy.

Recently discovered planographic printing plates having a photosensitizable surface of an association product of an ethylene oxide polymer and a phenolic resin produce outstanding prints in both continuous tone and half-tone. These plates are photosensitized by coating the netire plate with a suitable photosensitizing agent. The plate is then exposed to light through a negative. Those areas which are exposed to light become hydrophobic. Areas not exposed to light remain hydrophillic. While these printing plates provide many unique advantages, the necessity of employing costly and time consuming photographic services to obtain the required negative has increased the cost and inconvenience. In addition while the photosensitized plates need not be treated by dark-room techniques, open exposure to normal light for prolonged periods will adversely affect these plates until the unexposed photosensitizer is removed.

It is therefore an object of this invention to provide a method of photosensitizing planographic printing plates in which the use of costly negatives is not necessary.

It is another object of this invention to provide a method of photosensitizing a planographic printing plate for either half-tone or continuous-tone printing.

It is still another object of this invention to provide a photosensitized printing plate which will not be adversely affected by prolonged exposure to light.

It is yet another object of this invention to photosensitize planographic printing plates by means of a dry photosensitizer.

These and yet other objects of this invention will be apparent from the disclosure which follows.

In accordance with the present invention it has been found that the above objects are accomplished by xerographically photosensitizing a printing plate base of an association-product of an ethylene oxide polymer and a phenolic resin, with a dry, finely divided photosensitizing agent.

The process of xerographically photosensitizing planographic printing plates comprises the steps of projecting a photographic image or reflected image of the material to be copied onto an electrostatically charged xerographic surface which locally dissipates its electrostatic charge in proportion to the amount of light striking its surface, dusting the exposed xerographic surface with a dry finely divided photosensitizing agent which adheres to said xerographic surface in an amount proportional to the charge on said surface for a given area, and contacting the photosensitizing agent coated xerographic surface to an ethylene oxide polymer/phenolic resin association product printing plate surface thereby transferring photosensitizing agent from the xerographic surface to the printing plate surface. Exposure of the entire plate to light thereafter photosensitizes only image areas providing a positive printing plate. As indicated above image and non-image areas are not clearly exclusive areas. Tonal areas will receive a proportional amount of photosensitizing agent to accurately reproduce the copy. After the printing plate base is so photosensitized it can be exposed to unscreened light for an indefinite period of time without adversely affecting the plate and without the necessity of removing the photosensitizer after exposure.

In another embodiment of this invention the transfer of the photosensitizer dust image is made to the printing plate surface through an intermediate transfer sheet of plastic film.

By this method after the electrostatically charged xerographic surface has been exposed and dusted with finely divided photosensitizer to provide a photosensitizer dust image the xerographic surface is contacted with a self supporting plastic film thereby transferring the photosensitizer dust image to the plastic film. The plastic film carrier having the dust image on its surface is then contacted with the printing plate surface such that the photosensitizer dust image is transferred to the planographic printing plate surface. The carrier film can then be removed and the image photosensitized plate is exposed to a light source to impress the image on the plate as a latent printing image.

In another embodiment of this variation a transparent plastic carrier film is used. In this method after the carrier film has been provided with a photosensitizer dust image and has been placed on the printing plate surface the printing plate is exposed to a light source directly through the carrier film. The photosensitizer activates the plate in contact with it by the light passing through the carrier film.

Because the carrier film can exhibit excellent dielectric properties and exhibit enhanced flexibility in respect to the plate it is preferred to utilize this method. Similarly because the transparent carrier plate method deletes the step of removing the carrier film this method is most preferred.

While any self-supporting plastic film exhibiting a dielectric strength sufficiently high that an electrostatic charge can be induced upon its surface can be used, it has been found desirable to use films made from vinyl polymers. The vinyl polymers include the homopolymers and copolymers of vinyl monomers i.e. those containing the

group.

Illustrative of vinyl monomers containing the

group, and mixtures thereof which can be homopolymerized or copolymerized to form thermoplastic polymers which can be utilized in accordance with the present invention are the following: vinyl aryls such as styrene, o-methoxystyrene, p-methoxystyrene, m-methoxystyrene, o-nitrostyrene, m-nitrostyrene, o-methylstyrene, p-methylstyrene, m-methylstyrene, p-phenylstyrene, o-phenylstyrene, m-phenylstyrene, vinylnaphthalene and the like; vinyl and vinylidene halides such as vinyl chloride, vinylidene chloride, vinylidene bromide and the like; vinyl esters such as vinyl acetate, vinyl propionate, vinyl butyrate, vinyl chloroacetate, vinyl chloropropionate, vinyl benzoate, vinyl chlorobenzoate and the like; acrylic and alpha-alkyl acrylic acids, their alkyl esters, their amides and their nitriles such as acrylic acid, chloroacrylic acid, methacrylic acid, ethacrylic acid, methyl acrylate, ethyl acrylate, butyl acrylate, n-octyl acrylate, 2-ethylhexyl acrylate, n-decyl acrylate, methyl methacrylate, butyl methacrylate, methyl ethacrylate, ethyl ethacrylate, acrylamide, N-methyl acrylamide, N,N - di-methylacrylamide, methacrylamide, N - methyl methacrylamide, N,N - dimethyl methacrylamide, acrylonitrile, chloroacrylonitrile, methacrylonitrile, ethacrylonitrile, and the like; alkyl esters of maleic and fumaric acid such as dimethyl maleate, diethyl maleate and the like; vinyl alkyl esters and ketones such as vinyl methyl ether, vinyl ethyl ether, vinyl isobutyl ether, 2-chloroethyl vinyl ether, methyl vinyl ketone, ethyl vinyl ketone, isobutyl vinyl ketone, and the like; also vinyl pyridine, N-vinyl carbazole, N-vinyl pyrrolidine, ethyl methylene malonate and the like, and modified vinyl polymers such as polystyrene modified with rubber, polystyrene modified with hydrocarbon wax and the like.

While the vinyl polymers are preferred, olefin polymers, polyethers, polyesters, and other films can also be used provided they are sufficiently strong and exhibit a sufficiently high dielectric strength.

Because of their outstanding electrostatic properties polystyrene and polyvinyl chloride carrier films are preferred.

Carrier films can be of any thickness provided they are self-supporting and sufficiently flexible to be readily contacted with the xerographic surface. Generally, however, these carrier films have thicknesses of from 0.5 mil to 15 mils.

When the carrier film is used in the method of the present invention it is desirable to impress an electrostatic charge on the film opposite in polarity to that impressed on the xerographic surface as this enhances the transfer of the photosensitizer dust image. However, if not charge is placed on the carrier film, an opposite charge will be impressed on the film from the xerographic surface.

Xerographic surfaces are well known in the art. They generally comprise an electrically conductive substrate such as a metal coated with a material which can be electrostatically charged, but which will lose or dissipate that charge locally when exposed to light. Such coating materials have generally been defined as photoconductive materials having electrons in the non-conductive energy level activatable by illumination to a different energy level whereby an electric charge is free to migrate under an applied electric field of at least $10^3$ volts per centimeter. Such coatings generally exhibit a composite resistivity in the dark of $10^{10}$ ohm per centimeter.

Illustrative of such coating materials are selenium, sulfur, magnesium oxide, zinc oxide, selenium-tellurium alloys, cadmium sulfide, zinc sulfide, strontium sulfide, zinc selenide, zinc telluride, lead telluride, lead selenide and the like. Because of its exceptionally high dark electrical resistivity in comparison to its much lower illuminated electrical resistivity amorphous selenium is generally preferred. In the industry these xerographic substrates are used in the form of either a plate or drum, the latter generally being preferred for continuous operations.

The association product printing plates useful in the present invention are formed by intimately admixing an ethylene oxide polymer and a phenolic resin.

The ethylene oxide polymer component of these compositions is selected from the resinous ethylene oxide polymeric materials having an average molecular weight in the range of from about 50,000 to about 10,000,000, which are readily soluble in water. The term "ethylene oxide polymers" refers to polymers possessing the repeating unit (—$CH_2$—$CH_2O$—) as represented by the class of commercial Polyox resins; and the term is intended to include water soluble ethylene oxide polymer resins wherein ethylene oxide is the predominant monomer polymerized therein but which can also contain polymerized residues of other olefin oxides as exemplified by copolymers and terpolymers of ethylene oxide with other copolymerizable monomers containing single epoxide groups such as propylene oxide, butylene oxide, styrene oxide and the like. Poly(ethylene oxide) homopolymer is however preferred as the ethylene oxide polymer resin and shall be used hereinafter as representative of these resins.

The phenolic resin component of these compositions are the heat fusible condensation products of a phenol with an aldehyde. Such condensation products are divided into two classes, resoles and novolaks, either of which can be used in the preparation of these printing plate bases. These two types of resins are discussed in order below. Both of these classes of phenolic resins will form in association with ethylene oxide polymers.

While these phenolic resins are in the fusible form when making the association product, as hereinafter more clearly set forth, the fusible condition is not necessarily a critical condition of the association product, in which it is possible for a portion or all of the phenolic resin component to be fully advanced to the cured state.

The fusible resole phenolic resins can advance upon heating to a degree of cure and polymerization to attain a completely insoluble state. These insoluble phenolics cannot be used in the preparation of the present compositions but are believed to be present in the cured printing plate compositions of this invention. In the preparation of the present compositions only those heat fusible phenolic resins which are soluble in water, alkali or organic solvents such as acetone, ethanol and the like and which are sufficiently fusible to permit admixture and association with the ethylene oxide polymers can be used. These resins include those resole phenolic resins which have not cured to a degree of insolubility as well as the novolak resins discussed below.

*Resole resins.*—Resole resins, are generally produced by the condensation of phenols and aldehydes under alkaline conditions. Resoles differ from novolaks in that polynuclear methylol-substituted phenols are formed as intermediates in resoles. A resole produced by the condensation of phenol with formaldehyde most likely proceeds through an intermediate having the following illustrated type structure:

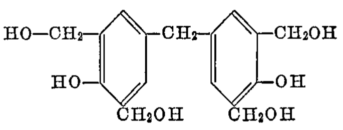

In a typical synthesis, resoles are prepared by heating one mole of phenol with 1.5 moles of formaldehyde under alkaline conditions.

The resole resins are prepared by the condensation of phenol with formaldehyde or, more generally, by the reaction of a phenolic compound, having two or three reactive aromatic ring hydrogen positions, with an aldehyde or aldehyde-liberating compound capable of undergoing phenol-aldehyde condensation. Illustration of phenolic compounds are cresol, xylenol, ethylphenol, butylphenol, isopropylmethoxyphenol, chlorophenol, resorcinol, hydroquinone, naphthol, 2,2-bis (p-hydroxyphenyl) propane, and the like. Illustrative of aldehydes are formaldehyde, acetaldehyde, acrolein, crotonaldehyde, furfural, and the like. Illustrative of aldehyde-liberating compounds are for example, paraformaldehyde, formalin and 1,3,5-trioxane. Ketones such as acetone are also capable of condensing with phenolic compounds, as are methylene engendering agents such as hexamethyletenetetramine.

The condensation of phenolic compound and aldehyde is conducted in the presence of alkaline reagents such as sodium carbonate, sodium acetate, sodium hydroxide, ammonium hydroxide, and the like. When the condensation reaction is completed, if desired the water and other volatile materials can be removed by distillation, and the catalyst neutralized.

*Novolak resins.*—The novolak resins are prepared in a manner similar to that used to prepare the resole resins. The distinguishing exception in this preparation is however that the reaction is generally conducted in an acidic media, instead of an alkaline media as is the case with the resoles. When less than six moles of formaldehyde are used per seven moles of phenol the products are permanently fusible and soluble. These are the novolak resins. The novolaks have a different structure than the resoles as is illustrated by the novolak condensation products of phenol with formaldehyde:

(a)

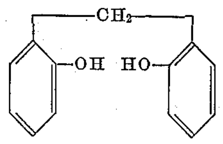

(b)

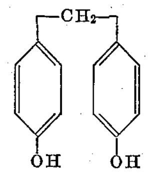

(c)

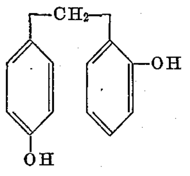

The novolaks can be further reacted with formaldehyde or with a methylol yielding compound such as hexamethylene tetramine, to a state of cure which is similar in the nature to the curing pattern of the resoles.

In a typical synthesis novolaks are prepared by heating one mole of phenol with 0.5 mole of formaldehyde under acidic conditions. The temperature at which the reaction is conducted is generally from about 25° C. to about 175° C.

The reactants which can be used in the preparation of the novolaks are the same as those used in the preparation of the resoles which are described and listed above.

While as previously stated both the resole resins and the novolak resins can be employed in the compositions of the present invention, it is preferred to use the resole resins, as printing plates formed from compositions utilizing them give sharper prints and have a longer printing life.

The most suitable fusible resole resins are those which are insoluble in water but readily soluble in conventional organic solvents such as methyl ethyl ketone, acetone, methanol, ethanol, and the like. Resole resins having a particularly desirable combination of properties are those which have an average molecular weight in the range between about three hundred fifty and six hundred. It is believed that these resole resins contain an average of at least one methylol group per aromatic nucleus.

The association product planographic printing plates generally contain from about 0.2 to about 3 parts by weight ethylene oxide polymer per part phenolic resin but preferred compositions contain from about 0.6 to about 1.8 parts by weight ethylene oxide polymer per part phenolic resin.

The term "printing plate base" as used herein refers to a planographic printing plate surface comprising an ethylene oxide polymer and phenolic resin in intimate association. Such printing plate bases may be in the form of coatings on various substrates, as self-supporting films; or laminates of such films and substrate materials.

Such printing plate base compositions can contain additives to enhance certain properties of the printing surface, such as photosensitivity, reduction of tack, toughness and the like. The presence or absence of such additives does not detract from the utility in the present invention of plates made from such compositions.

Similarly, in order to obtain printing plates exhibiting long printing lives it is desirable to insolubilize the phenolic resin ethylene oxide polymer association product printing plate prior to image photosensitization. This insolubilization can be conveniently effected by heating the resin for a time and at a temperature sufficient to insolubilize it to organic solvents such as dimethyl formamide, acetone and the like. Heating the plate at a temperature of from 120° C. to 200° C. for a period of from 5 to 30 minutes generally serves to effect insolubilization.

The photosensitizing agents useful in the present invention are those which are friable and normally solid at room temperature and which are capable of reaction with the surface of the polymeric printing plate base upon exposure to light causing it to become hydrophobic. Such photosensitizers are generally capable of releasing free radicals upon exposure to light energy at ambient temperatures and it is believed that said free radicals react with the association product as defined in greater detail below.

Preferred photosensitizers are the friable normally solid polyhalogenated alkanes containing from one to eight carbon atoms and polyhalogenated alkanols containing from two to eight carbon atoms inclusive and wherein said halogen atoms have an atomic weight in excess of 40. Illustrative of such photosensitizers are iodoform, triiodoethane, teraiodoethane, tetrabromoethane, iodobromohexane, hexabromooctane, triiodomethylpropanol hexaiiodohexanol, dibromodiiodooctanol and the like. Compounds having more than one halogen on the same carbon atom and preferably on terminal carbon atoms exhibit increased photosensitivity.

The photosensitizing ability of the various alkyl halides is a function of quantum yield; [1] which in turn depends upon the chemical structure of the respective iodides or bromides. Generally, the quantum yield increases as the number of halongen atoms in the compounds increases, and as the length of the hydrocarbon chain increases. The quantum yield is also higher in the iodine atoms are on a tertiary carbon atom rather than a primary or secondary carbon atom. On this basis, the photosensitizing

[1] Quantum yield refers to the number of molecules reacting chemically per photon of light absorbed.

ability of various iodides, in the order of increasing efficiency, is exemplified by the following sequence:

$$CH_3I < CH_3CH_2I < CH_3(CH_2)_2I < CH_3(CH_2)_3I < (CH_3)_3CI < CH_2I_2 < CHI_3$$

Iodoform is a particularly outstanding photosensitizing agent in the practice of the present invention.

The photosensitizing agent should be used in the present invention as a finely divided particulate in order to facilitate coating of the xerographic surface and to provide greater resolution of the image on transfer. Generally, photosensitizers having an average partical size of less than one micron are satisfactory although it is preferred that they have average partical sizes of less than 0.1 micron.

After the charge xerographic surface has been exposed to a light image, it is dusted with the finely divided photosensitizing agent. While the photosensitizing agent need only be used in an amount to sufficiently cover the charged areas of the plate in a density proportional to the charge on the various areas of the plate, the dusting generally provides an excess of photosensitizer. This dusting step is called cascading in reference to the copying art. By the cascading step toner or pigmented polymer, or in the present case photosensitizer, is literally cascaded over the xerographic surface.

While not wishing to be bound by any theory of mechanisms, it is believed that the outstanding characteristics of the photosensitive compositions of the present invention as employed in the preparation and use of half-tone and continuous tone planographic printing plates are mainly due to the "association" or "complex" formation between the phenolic resin component and the ethylene oxide polymer component. The term "association" refers to the interaction which provides the binding force between the ethylene oxide polymer component and the phenolic resin component. It is believed that the interaction involves one or more diverse mechanisms such as hydrogen bonding, electrostatic bonding, secondary valence forces, and the like. It appears that the phenomenon concerning hydrogen bonding can best explain the nature of the interaction. The "associating" or "complexing" interaction between the phenolic resin component and the ethylene oxide polymer component in the photosensitive compositions might be visualized in the following manner:

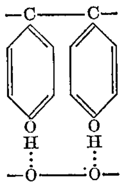

The "association" of the resole resin component and the ethylene oxide polymer component causes the formation of a tough, hydrophilic material when sheeted or molded. The water receptivity of this "association" product declines as the phenolic resin "advances," that is, increases in molecular weight and/or in degree of crosslinking on exposure to light, and the methylol content of the resole resin decreases. Radicals released by the action of light on the photosensitive substance in the composition (for example, iodine radicals released from iodoform) react or affect with the resole phenolic resin, to produce intermediate chemical products the ethylene oxide polymer and/or the association between these resins. These products presumably react with each other as well as with unactivated resin molecules to produce hydrophobic areas on the otherwise hydrophillic plate.

This causes the water receptivity of the phenolic resin-ethylene oxide polymer coating to decline in proportion of the radicals produced, which is in turn proportional to the intensity of the light received by a particular portion of the coating during exposure.

The above-postulated mechanisms of interaction are merely theoretical and should not be construed as limiting thereto. Other theories or reasons may equally well explain the true nature of the interaction.

In the practice of this invention various expedients may be used to increase the efficiency of the process of this invention without departing from the scope thereof. Such means include charging the finely divided particles of photosensitizer with a charge opposite to that placed upon the xerographic surface to cause the particles to have a greater attraction to the charged areas of the xerographic surface. Similarly the planographic printing plate base may be charged with an electrostatic charge opposite to that of the photosensitizer to facilitate transfer of the particles from the xerographic surface to the printing plate base.

Carriers may be added to the finely divided particulate photosensitizing agent to facilitate dusting the charged xerographic surface and subsequent transfer to the printing plate base. such carriers are well known in the art.

ILLUSTRATION I

This illustration exemplifies the preparation of conventional phenolic resins useful in the practice of the present invention.

(a) *Phenol-formaldehyde resole resin*

A mixture consisting of 1 mole of phenol, 3 moles of paraformaldehyde, 6 moles of water and 0.3 mole of sodium acetate trihydrate is refluxed at atmospheric pressure for a period of time between about two and one-half hours and three and one-half hours until the solution be comes cloudy. Two distinct phases begin to form as the resin precipitates from the refluxing mixture. Heating is continued for an additional five minutes and the hot mixture is then poured into water to completely precipitate the resin. The solid resin is recovered by filtration or decantation or other suitable separation method and washed thoroughly with water. The resin is dissolved in a suitable solvent such as methyl ethyl ketone, and anhydrous sodium sulfate is added to dry the solution. The water free solution is recovered by filtering out the sodium sulfate.

(b) *Meta-cresole-formaldehyde resole resin*

Meta-cresole, paraformaldehyde and sodium acetate trihydrate in a molar ratio of 1:2.5:0.3, respectively, are mixed in water to form a dilute slurry (about 200 milliliters of water per mole of meta-cresole). This mixture is refluxed at atmospheric pressure until resin begins to precipitate, which is normally about a twenty-minute reaction period. The heating is continued an additional five minutes, and the reaction mixture is poured into cold water to completely precipitate the resin. An anhydrous solution of the resin in methyl ethyl ketone is prepared in the same manner as above.

(c) *Resorcinol-formaldehyde resole resin*

A mixture of resorcinol, sodium sulfate and formalin (37 percent solution of formaldehyde in water) in a molar ratio of about 1:0.2:0.8, respectively, is dissolved in water (about 100 milliliters of water per mole of resorcinol). The reaction mixture is heated on a steam bath until the solution turns cloudy, then it is poured into cold water to completely precipitate the resin product. The resin is recovered and prepared as an anhydrous solution in methyl ethyl ketone in the manner described above.

(d) *Phenol-formaldehyde novolak resin*

One hundred grams of phenol is dissolved in 69 grams of 37 percent Formalin solution and about 0.55 grams of oxalic acid is added. This mixture is refluxed at a temperature of about 80° C. for a period of about 6 hours at the end of which period the solution becomes cloudy. Water is then distilled from the reaction mixture until the temperature of the resinous mass reaches about 150° C. The resin is then discharged from the reaction vessel and allowed to cool. At room temperature the cooled resin is brittle and is readily pulverized to a powdery state.

ILLUSTRATION II

*Preparation of an association product printing plate*

An association product printing plate was prepared by dissolving 8 grams of a resole phenol-formaldehyde resin, 12 grams of ethylene oxide homopolymer having a molecular weight of 2 to 3 million in 600 milliliters of N,N-dimethyl foramide, and 2 grams of ortho tolidine. These ingredients were dissolved by blending for a period of about 40 minutes on a high speed vortex blender. The resultant solution was coated on a aluminum plate through the utilization of a standard whirl-coating apparatus. The plate was then baked for a period of about 20 minutes at a temperature of 160° C. The plate was then ready for use.

EXAMPLE I

A continuous tone subject was exposed to an electrostatically charged selenium coated plate for 20 seconds using a commercial xerographic camera. The image was developed using a commercial cascade apparatus. The photosensitizing agent used to dust the charged plate was finely divided iodoform. An excellent image was obtained on the xerographic plate. This image was formed by the photosensitizer dust.

An association product printing plate was prepared as described in Illustration II, above. The photosensitizer dust image was transferred to the association product printing plate by contacting the dusted xerographic plate to the printing plate and reversing the charge on the xerographic plate. The photosensitizer dust image was thus transferred to the printing plate.

The printing plate was then exposed to a 21 ampere carbon arc for a period of one minute at a distance of two feet. The exposed plate was mounted on a commercial offset printing press and copies were run off. The prints were in continuous tone and of excellent quality.

EXAMPLE II

A half-tone subject which also contained printed text was exposed to an electrostatically charged selenium coated plate using a commercial xerographic camera for an exposure of 10 seconds. The image was developed using a commercial cascading unit. The photosensitizing agent used in the cascading unit was finely divided 1,1,1-tribromo-2-methyl-2-propanol. The resultant image was transferred to a thin film of clear polystyrene by reversing the charge. The polystyrene film was placed image down on the surface of an association product plate prepared as described in Illustration II above. The plate was then exposed to a 21 ampere carbon arc lamp for a period of 5 minutes at a distance of two feet, through the transparent polystyrene carrier film. The carrier film was then removed, the planographic printing plate was mounted on a conventional offset printing plate and copies were run off. The prints obtained were of excellent quality.

What is claimed is:

1. The process of image photosensitizing a planographic printing plate base of an association product of an ethylene oxide polymer and a phenolic resin which comprises the steps of electrostatically charging a xerographic surface in the absence of light, exposing said charged xerographic surface to a light energy image causing said surface to lose electrostatic charge locally in an amount proportional to the light striking its surface thereby forming a latent electrostatic image, dusting the exposed xerographic surface with a friable normally solid, finely divided photosensitizing agent in an amount sufficient to cover all electrostatically charged areas of the said xerographic surface, contacting said dusted xerographic surface with the planographic printing plate base thereby transferring said photosensitizing agent to said base, and exposing said photosensitized base to light energy.

2. The process of claim 1 wherein the xerographic surface contains amorphous selenium.

3. The process of claim 1 wherein the ethylene oxide polymer is ethylene oxide homopolymer.

4. The process of claim 1 wherein the phenolic resin is a resole phenolic resin.

5. The process of claim 1 wherein the friable, normally solid photosensitizing agent is a member of the group consisting of polyhalogenated alkanes containing from 1 to 8 carbon atoms inclusive and polyhalogenated alkanols containing from 2 to 8 carbon atoms inclusive wherein said halogen atoms exhibit an atomic weight in excess of 40.

6. The process of claim 1 wherein said friable normally solid photosensitizing agent is a polyhalogenated alkane containing from 1 to 8 carbon atoms inclusive and wherein said halogen atom exhibits an atomic weight in excess of 40.

7. The process of claim 1 wherein said friable normally solid photosensitizing agent is a polyhalogenated alkanol containing from 2 to 8 carbon atoms and wherein said halogen atoms exhibit an atomic weight in excess of 40.

8. The process of claim 1 wherein said friable normally solid photosensitizing agent is iodoform.

9. The process of claim 1 wherein said friable normally solid photosensitizing agent is 1,1,1-tribromo-2-methyl-2 propanol.

10. The process of claim 1 wherein an electrostatic charge is impressed upon said friable normally solid photosensitizing agent and wherein said charge is opposite to that impressed upon said xerographic surface.

11. The process of claim 1 wherein an electrostatic charge is impressed upon said planographic printing plate base and wherein said charge is of the same polarity as that impressed upon said xerographic surface.

12. The process of image photosensitizing a planographic printing plate base of an association product of an ethylene oxide polymer and a phenolic resin which comprises the steps of electrostatically charging a xerographic surface in the absence of light, exposing said charged xerographic surface to a light energy image causing said surface to lose electrostatic charge locally in an amount proportional to the light striking its surface thereby forming a latent electrostatic image, dusting, the exposed xerographic surface with a friable, normally solid, finely divided photosensitizing agent in an amount sufficient to cover all electrostatically charged areas of the said xerographic surface, contacting said dusted xerographic surface with a self-supporting plastic film which exhibits a relatively high dielectric strength thereby transferring the photosensitizer dust image from the xerographic surface to the plastic film, placing said film surface containing said photosensitizer dust in contact with the surface of the association product printing plate thereby transferring said photosensitizer image to the printing plate surface, and exposing said image photosensitized printing plate to a light source.

13. The method of claim 12 wherein the self-supporting plastic film is a vinyl polymer film.

14. The method of claim 12 wherein the self-supporting film is polyvinyl chloride.

15. The method of claim 12 wherein the plastic film is polystyrene.

16. The method of claim 12 wherein the self-supporting plastic film is transparent and the printing plate base in contact with the photosensitizer image and plastic film is exposed to light through the film.

17. The method of claim 16 wherein the transparent self-supporting plastic film is polyvinyl chloride.

18. The method of claim 16 wherein the transparent self-supporting plastic film is polystyrene.

19. The method of claim 12 wherein the photosensitizing agent is a friable normally solid polyhalogenated alkane containing from one to eight carbon atoms inclusive.

20. The method of claim 19 wherein the photosensitizing agent is iodoform.

References Cited

UNITED STATES PATENTS

| | | | |
|---|---|---|---|
| 2,990,278 | 6/1961 | Carlson | 96—1.4 |
| 3,083,117 | 3/1963 | Schmiedel et al. | 117—17.5 |
| 3,207,601 | 9/1965 | Giaimo | 96—1 |
| 3,298,830 | 1/1967 | Simm et al. | 96—1 |
| 3,309,202 | 3/1967 | Silver | 96—85 |

NORMAN G. TORCHIN, *Primary Examiner.*

G. E. VAN HORN, *Assistant Examiner.*